US011260427B2

(12) United States Patent
Tsukamoto

(10) Patent No.: US 11,260,427 B2
(45) Date of Patent: Mar. 1, 2022

(54) VACUUM APPARATUS AND RECOVERY SUPPORT METHOD

(71) Applicant: JEOL Ltd., Tokyo (JP)

(72) Inventor: Kazunori Tsukamoto, Tokyo (JP)

(73) Assignee: JEOL Ltd., Tokyo (JP)

( * ) Notice: Subject to any disclaimer, the term of this patent is extended or adjusted under 35 U.S.C. 154(b) by 140 days.

(21) Appl. No.: 16/534,065

(22) Filed: Aug. 7, 2019

(65) Prior Publication Data

US 2020/0055092 A1 Feb. 20, 2020

(30) Foreign Application Priority Data

Aug. 15, 2018 (JP) .............................. JP2018-152838

(51) Int. Cl.
*H01J 37/18* (2006.01)
*B07C 5/34* (2006.01)
*B07C 5/36* (2006.01)
*G05B 23/02* (2006.01)

(52) U.S. Cl.
CPC ............... *B07C 5/34* (2013.01); *B07C 5/362* (2013.01); *G05B 23/0267* (2013.01); *H01J 37/18* (2013.01); *H01J 2237/026* (2013.01); *H01J 2237/26* (2013.01); *H01J 2237/30* (2013.01)

(58) Field of Classification Search
CPC .. H01J 37/18; H01J 2237/026; H01J 2237/26; H01J 37/24; H01J 2237/30; B07C 5/34; B07C 5/362; G05B 23/0267; G05B 23/0286
See application file for complete search history.

(56) References Cited

U.S. PATENT DOCUMENTS

| 5,700,127 A | * | 12/1997 | Harada | H01L 21/67161 |
| | | | | 414/416.08 |
| 8,330,101 B2 | * | 12/2012 | Seyfarth | H01J 49/107 |
| | | | | 250/288 |
| 2005/0187649 A1 | * | 8/2005 | Funk | G05B 19/4184 |
| | | | | 700/121 |
| 2009/0114346 A1 | * | 5/2009 | Yashima | H01L 21/67276 |
| | | | | 156/345.24 |
| 2009/0279989 A1 | * | 11/2009 | Wong | H01L 21/68 |
| | | | | 414/217 |

(Continued)

FOREIGN PATENT DOCUMENTS

JP 07036729 A 2/1995

*Primary Examiner* — Wyatt A Stoffa
(74) *Attorney, Agent, or Firm* — The Webb Law Firm

(57) ABSTRACT

A vacuum apparatus equipped with an automatic transport mechanism for transporting a specimen and a sensor for detecting a state of the vacuum apparatus includes: a determining unit which determines whether a recoverable error has occurred based on a signal from the sensor; and a display control unit which causes, when it is determined that a recoverable error has occurred, a display unit to display a procedure of a recovery operation in a wizard format. The display control unit determines whether the recovery operation has been performed according to the procedure displayed on the display unit based on a signal from the sensor, and causes the display unit to display a next procedure of the recovery operation when it is determined that the recovery operation has been performed according to the procedure.

3 Claims, 9 Drawing Sheets

(56) References Cited

U.S. PATENT DOCUMENTS

| | | | |
|---|---|---|---|
| 2011/0231117 A1* | 9/2011 | Cardinale | G01L 27/007 |
| | | | 702/53 |
| 2014/0081581 A1* | 3/2014 | Borenstein | G01D 3/024 |
| | | | 702/24 |
| 2016/0163508 A1* | 6/2016 | Iwaya | H01J 37/20 |
| | | | 204/192.33 |
| 2016/0372386 A1* | 12/2016 | Song | H01J 37/32972 |
| 2018/0301318 A1* | 10/2018 | Iwaya | H01J 37/3005 |

* cited by examiner

WHEN SPECIMEN REPLACING ROD STOPS, AFTER MANUALLY DEPRESSING TIP OF SPECIMEN REPLACING ROD TO PLACE TIP IN VERTICAL STATE, CLICK "OUT" BUTTON. SPECIMEN REPLACING ROD ROTATES 90° WITH EACH DEPRESSION
ONCE SPECIMEN REPLACING ROD STOPS, CLICK "NEXT" BUTTON

VERTICAL STATE

HORIZONTAL STATE

OUT    NEXT

207

RECOVERY IS COMPLETED AND SPECIMEN CAN NOW BE REMOVED.
SPECIMEN HOLDER ON SPECIMEN STAGE CAN BE REMOVED BY NORMAL SPECIMEN REPLACEMENT OPERATION.

COMPLETE

FIG. 9

VACUUM APPARATUS AND RECOVERY SUPPORT METHOD

CROSS-REFERENCE TO RELATED APPLICATION

This application claims priority to Japanese Patent Application No. 2018-152838 filed Aug. 15, 2018, the disclosure of which is hereby incorporated by reference in its entirety.

BACKGROUND OF THE INVENTION

Field of the Invention

The present invention relates to a vacuum apparatus and a recovery support method.

Description of Related Art

JP-A-7-36729 discloses a recovery support apparatus which, upon an occurrence of a failure of an electronic apparatus, investigates a cause from collected diagnostic information, reads out corresponding recovery procedures based on the cause of the failure and measures, and displays the recovery procedures on a recovery support screen display unit.

With a recovery support apparatus such as that described above, when a user conducts recovery work while looking at a recovery support screen, since the user is to determine whether or not a procedure or an operation is correct, there is a risk of performing a wrong recovery operation and, further, damaging the apparatus.

SUMMARY OF THE INVENTION

The invention is capable of providing a vacuum apparatus and a recovery support method which enable a user to easily perform a recovery.

According to a first aspect of the invention, there is provided a vacuum apparatus equipped with an automatic transport mechanism for transporting a specimen and a sensor for detecting a state of the vacuum apparatus, the vacuum apparatus including:

a determining unit which determines whether or not a recoverable error has occurred based on a signal from the sensor; and a display control unit which causes, when the recoverable error is determined to have occurred, a display unit to display procedure of a recovery operation in a wizard format, the display control unit determining whether or not the recovery operation has been performed according to the procedure displayed on the display unit based on a signal from the sensor, and causing the display unit to display next procedure of the recovery operation when the recovery operation is determined to have been performed according to the procedure.

According to a second aspect of the invention, there is provided a recovery support method of a vacuum apparatus equipped with an automatic transport mechanism for transporting a specimen and a sensor for detecting a state of the vacuum apparatus, the recovery support method including:

a determination step of determining whether or not a recoverable error has occurred based on a signal from the sensor; and a display control step of causing a display unit to display procedure of a recovery operation in a wizard format when the recoverable error is determined to have occurred, in the display control step, a determination being made as to whether or not the recovery operation has been performed according to the procedure displayed on the display unit based on a signal from the sensor, and when the recovery operation is determined to have been performed according to the procedure, next procedure of the recovery operation being displayed on the display unit.

BRIEF DESCRIPTION OF THE DRAWINGS

FIG. 9 is a diagram illustrating an example of a procedure of a recovery operation displayed in a wizard format.

Figure 1:
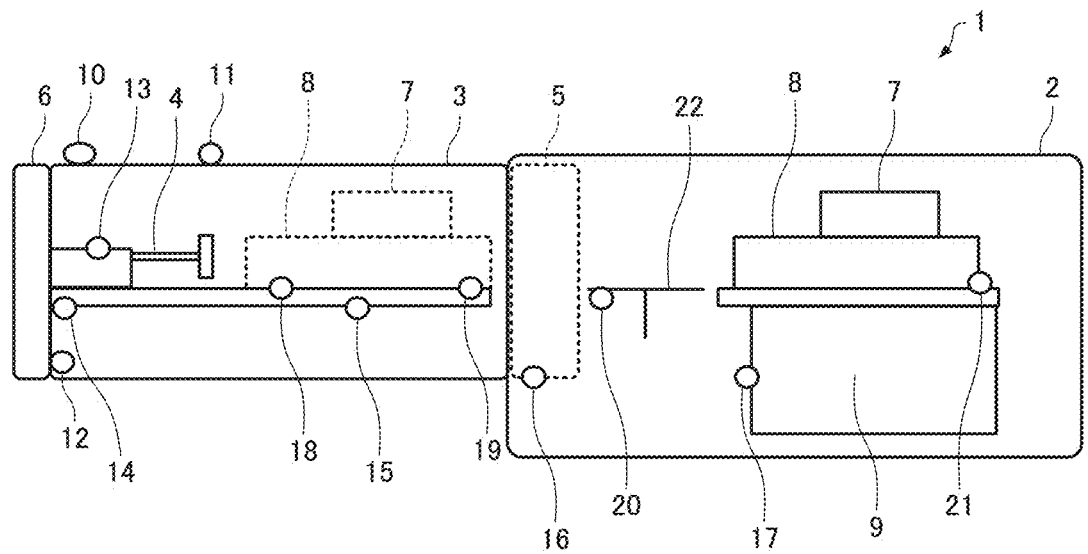
FIG. 1 is a diagram schematically illustrating an example of a vacuum apparatus according to an embodiment of the invention.

DESCRIPTION OF THE INVENTION (1) According to an embodiment of the invention, there is provided a vacuum apparatus equipped with an automatic transport mechanism for transporting a specimen and a sensor for detecting a state of the vacuum apparatus, the vacuum apparatus including:

a determining unit which determines whether or not a recoverable error has occurred based on a signal from the sensor; and a display control unit which causes, when the recoverable error is determined to have occurred, a display unit to display procedure of a recovery operation in a wizard format, the display control unit determining whether or not the recovery operation has been performed according to the procedure displayed on the display unit based on a signal from the sensor, and causing the display unit to display next procedure of the recovery operation when the recovery operation is determined to have been performed according to the procedure.

According to an embodiment of the invention, there is provided a recovery support method of a vacuum apparatus equipped with an automatic transport mechanism for transporting a specimen and a sensor for detecting a state of the vacuum apparatus, the recovery support method including:

a determination step of determining whether or not a recoverable error has occurred based on a signal from the sensor; and a display control step of causing a display unit to display procedure of a recovery operation in a wizard format when the recoverable error is determined to have occurred, in the display control step, a determination being made as to whether or not the recovery operation has been performed according to the procedure displayed on the display unit based on a signal from the sensor, and when the recovery operation is determined to have been performed according to the procedure, next procedure of the recovery operation being displayed on the display unit.

According to the embodiments described above, by displaying procedure of a recovery operation in a wizard format, and when it is determined that the recovery operation has been performed according to the procedure based on a signal from the sensor, by displaying a screen showing next procedure, a user can easily perform the recovery operation without making mistakes.

(2) In the vacuum apparatus described above, the display control unit may cause the display unit to display a control button for operating the vacuum apparatus when the procedure of the recovery operation includes procedure for operating the vacuum apparatus, and the vacuum apparatus may further include a drive control unit which performs control to cause the vacuum apparatus to operate in response to an operation of the control button.

In the display control step in the recovery support method described above, when the procedure of the recovery operation includes procedure for operating the apparatus, a control button for operating the vacuum apparatus may be displayed on the display unit, and the recovery support method may further include a drive control step of performing control to cause the vacuum apparatus to operate in response to an operation of the control button.

According to the embodiments described above, when the procedure of the recovery operation includes procedure for operating the vacuum apparatus, by displaying a control button for operating the vacuum apparatus, the user can perform the recovery operation without hesitation.

(3) In the vacuum apparatus described above, when the display control unit is unable to determine whether or not the recovery operation has been performed according to the procedure of the recovery operation based on a signal from the sensor, the display control unit may cause the display unit to display operation procedure for enabling the determination.

In the display control step in the recovery support method described above, when a determination as to whether or not the recovery operation has been performed according to the procedure of the recovery operation cannot be made based on a signal from the sensor, the display unit may be caused to display operation procedure for enabling the determination.

According to the embodiments described above, when a determination as to whether or not the recovery operation has been performed according to the procedure of the recovery operation cannot be made by the sensor, by guiding operations to a state where the determination can be made by the sensor and determining whether or not the recovery operation has been performed according to the procedure of the recovery operation, the user can perform the recovery operation without making mistakes.

(4) In the vacuum apparatus described above, when the display control unit determines that the recovery operation has been performed according to the procedure displayed on the display unit, the display control unit may enable a transition button for making a transition to a screen showing next procedure of the recovery operation, and when an operation of the transition button is performed, the display control unit may cause the display unit to display the next procedure.

In the display control step in the recovery support method described above, when it is determined that the recovery operation has been performed according to the procedure displayed on the display unit, a transition button for making a transition to a screen showing next procedure of the recovery operation may be enabled, and when an operation of the transition button is performed, the display unit may be caused to display the next procedure.

Embodiments of the invention are described in detail below with reference to the drawings. Note that the following embodiments do not unduly limit the scope of the invention as stated in the claims. In addition, all of the elements described below are not necessarily essential requirements of the invention.

1. Configuration

FIG. 1 schematically illustrates a vacuum apparatus 1 according to an embodiment of the invention. Alternatively, the vacuum apparatus 1 may be configured by omitting a part of the components (units) illustrated in FIG. 1. The vacuum apparatus 1 is a vacuum apparatus provided in an observation apparatus such as an electron microscope, an analysis apparatus such as an electron-probe microanalyzer (EPMA), or a processing apparatus such as a focused ion-beam apparatus (FIB). The vacuum apparatus 1 includes a specimen chamber 2, a specimen replacing chamber 3, and a specimen replacing rod 4 provided in the specimen replacing chamber 3. The specimen chamber 2 is a space in which a specimen is placed during observation (analysis, processing), and the specimen replacing chamber 3 is a space provided for inserting and removing a specimen to and from the specimen chamber 2 without venting the specimen chamber 2. The specimen replacing chamber 3 is configured to be capable of performing pre-evacuation due to an isolation valve 5 being provided on a side of the specimen chamber 2 in the specimen replacing chamber 3 and a replacing chamber door 6 being provided on an atmospheric pressure side in the specimen replacing chamber 3.

A specimen is mounted to a specimen holder 7, and the specimen holder 7 is mounted to a holder adapter 8. The specimen holder 7 and the holder adapter 8 depicted by solid lines in the diagram represent a state where the specimen holder 7 and the holder adapter 8 are on a specimen stage 9 inside the specimen chamber 2, and the specimen holder 7 and the holder adapter 8 depicted by dotted lines in the diagram represent a state where the specimen holder 7 and the holder adapter 8 are inside the specimen replacing chamber 3. The specimen stage 9 moves the specimen holder 7 and the holder adapter 8 in a horizontal direction and a vertical direction inside the specimen chamber 2.

The specimen replacing rod 4 constitutes an automatic transport mechanism which transports (inserts and removes) a specimen between the specimen chamber 2 and the specimen replacing chamber 3 when replacing a specimen. The specimen replacing rod 4 is driven by a replacing rod drive motor 10, and a tip section of the specimen replacing rod 4 moves in a lateral direction. The tip section of the specimen replacing rod 4 is configured so as to be coupleable to the holder adapter 8. The tip section of the specimen replacing rod 4 rotates 90 degrees every time the tip section of the specimen replacing rod 4 is depressed and changes from a vertical state to a horizontal state or from a horizontal state to a vertical state. When the tip section of the specimen replacing rod 4 in the vertical state comes into contact with the holder adapter 8 and is depressed toward the side of the holder adapter 8, the tip section rotates to assume the horizontal state and is coupled to the holder adapter 8. In addition, when the tip section of the specimen replacing rod 4 in the horizontal state (a state of being coupled to the holder adapter 8) is depressed toward the side of the holder adapter 8, the tip section rotates to assume the vertical state and the coupling with the holder adapter 8 is released. By moving the tip section of the specimen replacing rod 4 toward the side of the specimen chamber 2 (rightward) in a state where the tip section is coupled to the holder adapter 8 present inside the specimen replacing chamber 3, the specimen holder 7 can be transported from the specimen replacing chamber 3 to the specimen chamber 2. In addition, by moving the tip section of the specimen replacing rod 4 toward the side of the specimen replacing chamber 3 (leftward) in a state where the tip section is coupled to the holder adapter 8 present inside the specimen chamber 2, the specimen holder 7 can be transported from the specimen chamber 2 to the specimen replacing chamber 3.

The specimen replacing chamber 3 is provided with a sensor 11 (a vacuum gauge) which measures pressure in the specimen replacing chamber 3, a sensor 12 which detects whether the replacing chamber door 6 is open or closed, a sensor 13 which detects a rotation state of the tip section of the specimen replacing rod 4 (whether the tip section is in the horizontal state or the vertical state), and sensors 14 and 15 which detect a position of the tip section of the specimen replacing rod 4. The sensor 14 can detect that the tip section of the specimen replacing rod 4 is at a left end position (the specimen replacing rod 4 is in a fully contracted state), and the sensor 15 can detect that the tip section of the specimen replacing rod 4 is at a right end position (the specimen replacing rod 4 is in a fully extended state). It should be noted that the sensor 13 can detect the rotation state of the tip section of the specimen replacing rod 4 only when the tip section is at the left end position. In addition, the specimen chamber 2 is provided with a sensor 16 which detects whether the isolation valve 5 is open or closed and a sensor 17 which detects a position of the specimen stage 9 inside the specimen chamber 2. Furthermore, the vacuum apparatus 1 is provided with sensors 18 to 21 which detect a position of the holder adapter 8, and among the sensors 18 to 21, the sensors 18 and 19 are provided in the specimen replacing chamber 3, the sensor 20 is provided in a T-shaped section 22 inside the specimen chamber 2, and the sensor 21 is provided on the specimen stage 9. The sensors 18 and 19 can detect that the holder adapter 8 is positioned in the specimen replacing chamber 3, the sensor 20 can detect that the holder adapter 8 is positioned between the specimen replacing chamber 3 and the specimen chamber 2 (a position straddling the isolation valve 5), and the sensor 21 can detect that the holder adapter 8 is positioned on the specimen stage 9.

Figure 2:
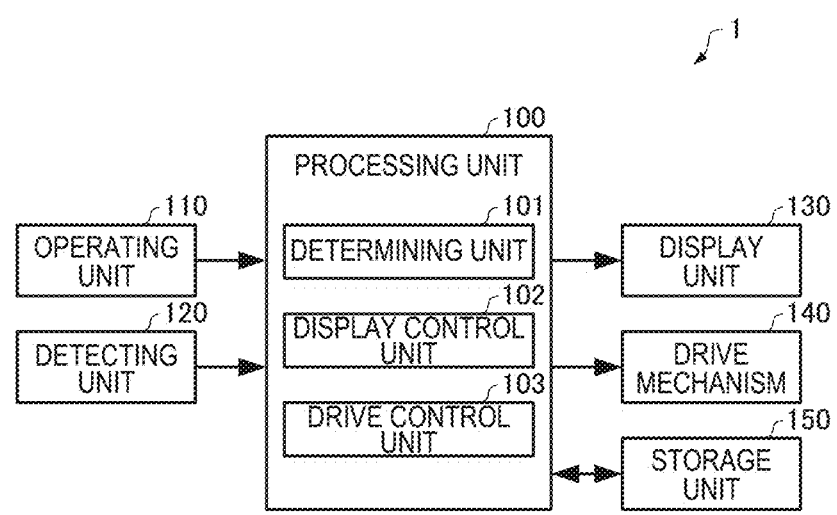
FIG. 2 is a diagram illustrating an example of functional block diagrams of a vacuum apparatus according to an embodiment of the invention.

FIG. 2 illustrates an example of functional block diagrams of the vacuum apparatus 1 described above. The vacuum apparatus 1 includes a processing unit 100, an operating unit 110, a detecting unit 120 (sensors), a display unit 130, a drive mechanism 140, and a storage unit 150.

The operating unit 110 enables a user to input operation information and outputs input operation information to the processing unit 100. Functions of the operating unit 110 can be realized by hardware such as a keyboard, a mouse, a button, a touch panel, or a touch pad.

The detecting unit 120 is sensors that detect a state of the apparatus (the vacuum apparatus 1, the automatic transport mechanism) and includes the sensors 11 to 21. A detection signal of each sensor included in the detecting unit 120 is output to the processing unit 100.

The display unit 130 displays an image generated by the processing unit 100, and functions of the display unit can be realized by an LCD, a CRT, a touch panel which also functions as the operating unit 110, or the like.

The drive mechanism 140 includes a drive apparatus (the replacing rod drive motor 10) of the specimen replacing rod 4, a drive apparatus of a vacuum pump, a drive apparatus of a vacuum valve, and a drive apparatus of the specimen stage 9.

The storage unit 150 stores programs and various data which enable a computer to function as the respective units of the processing unit 100 and functions as a work area of the processing unit 100, and the functions of the storage unit 150 can be realized by a hard disk, a RAM, or the like.

The processing unit 100 (a computer) performs various processes based on operation information, signals from the detecting unit 120, programs, and the like. Functions of the processing unit 100 can be realized by hardware including various processors (a CPU, DSP, or the like) and by programs. The processing unit 100 includes a determining unit 101, a display control unit 102, and a drive control unit 103.

The determining unit 101 determines whether or not a recoverable error (an error from which recovery is possible by an operation of the user) has occurred based on a signal from one or a plurality of sensors included in the detecting unit 120. For example, data identifying a type of a recoverable error corresponding to a combination of symbols from the respective sensors included in the detecting unit 120 may be stored in the storage unit 150, whereby the determining unit 101 refers to the data based on a combination of symbols from the respective sensors and determines whether or not there is an error corresponding to the combination.

When it is determined by the determining unit 101 that a recoverable error has occurred, the display control unit 102 performs control for causing the display unit 130 to display, in a wizard format, procedures of a recovery operation in order to recover from the error. For example, data for displaying procedures of a recovery operation in a wizard format may be stored in the storage unit 150 in association with a type of each recoverable error, whereby the display control unit 102 reads out data corresponding to a type of the occurred error and causes procedures of a recovery operation in order to recover from the error to be displayed in a wizard format. Each procedure of the recovery operation is displayed by a text, a diagram, or a photograph indicating an operation procedure, or a combination thereof.

In addition, the display control unit 102 determines whether or not a recovery operation has been performed according to a procedure being displayed on the display unit 130 based on a signal from one or a plurality of sensors included in the detecting unit 120, and when the display control unit 102 determines that the recovery operation has been performed according to the procedure, the display control unit 102 causes the display unit 130 to display a next procedure of the recovery operation. Furthermore, when the display control unit 102 determines that a recovery operation has been performed according to a procedure being displayed on the display unit 130, the display control unit 102 may enable a transition button for making a transition to a screen showing a next procedure of the recovery operation, and when an operation with respect to the enabled transition button is performed, the display control unit 102 may cause the display unit 130 to display the next procedure. Enabling the transition button means that the transition button is changed from an inoperable state to an operable state. When enabling the transition button, the transition button may be changed from a hidden state to a displayed state or the transition button having been displayed translucently may be displayed opaquely. In addition, when the procedures of the recovery operation include a procedure for operating the apparatus, the display control unit 102 causes the display unit 130 to display a control button for operating the apparatus. Furthermore, when the display control unit 102 is unable to determine whether or not a recovery operation has been performed according to a procedure of the recovery operation based on a signal from a sensor included in the detecting unit 120, the display control unit 102 causes the display unit 130 to display an operation procedure for enabling the determination based on a signal from the detecting unit 120.

The drive control unit 103 outputs a control signal to the drive mechanism 140 and performs control for operating the drive mechanism 140. For example, when an operation for issuing an instruction to insert the specimen holder 7 into the specimen stage 9 is performed by the user, the drive control unit 103 drives the replacing rod drive motor 10 and moves the tip section of the specimen replacing rod 4 being coupled with the holder adapter 8 toward the side of the specimen chamber 2 to transport the specimen holder 7 to the specimen stage 9, and moves the tip section of the specimen replacing rod 4 of which coupling with the holder adapter 8 has been released toward the side of the specimen replacing chamber 3. In addition, when an operation for issuing an instruction to remove the specimen holder 7 is performed by the user, the drive control unit 103 drives the replacing rod drive motor 10 and moves the tip section of the specimen replacing rod 4 not being coupled with the holder adapter 8 toward the side of the specimen chamber 2 to couple the tip section with the holder adapter 8, and moves the tip section of the specimen replacing rod 4 being coupled with the holder adapter 8 toward the side of the specimen replacing chamber 3 to transport the specimen holder 7 to the specimen replacing chamber 3. Furthermore, the drive control unit 103 operates the drive mechanism 140 in accordance with an operation with respect to the control button displayed on a screen of a wizard during recovery.

2. Method

Next, a method according to the embodiment described above will be described with reference to the drawings. FIGS. 3 to 9 illustrate examples of a recovery wizard (procedures of a recovery operation displayed in a wizard format) which is displayed on the display unit 130 when a recoverable error occurs. In this example, since the specimen holder 7 and the holder adapter 8 are detected to be present on the specimen stage 9 according to a signal from the sensor 21, the tip section of the specimen replacing rod 4 is detected to be at the left end position according to a signal from the sensor 14, and the tip section of the specimen replacing rod 4 is detected to be in the horizontal state according to a signal from the sensor 13, it is determined that a recoverable error (an abnormality of a rotation state of the tip section of the specimen replacing rod 4) has occurred. In this case, since the tip section of the specimen replacing rod 4 is in the horizontal state, even when the user performs an operation for issuing an instruction to remove the specimen holder 7, the tip section of the specimen replacing rod 4 is not coupled to the holder adapter 8 and the specimen holder 7 cannot be removed. In order to recover from this error, the user must perform a recovery operation that involves manually depressing the tip section of the specimen replacing rod 4 and changing the tip section from the horizontal state to the vertical state.

Figure 3:
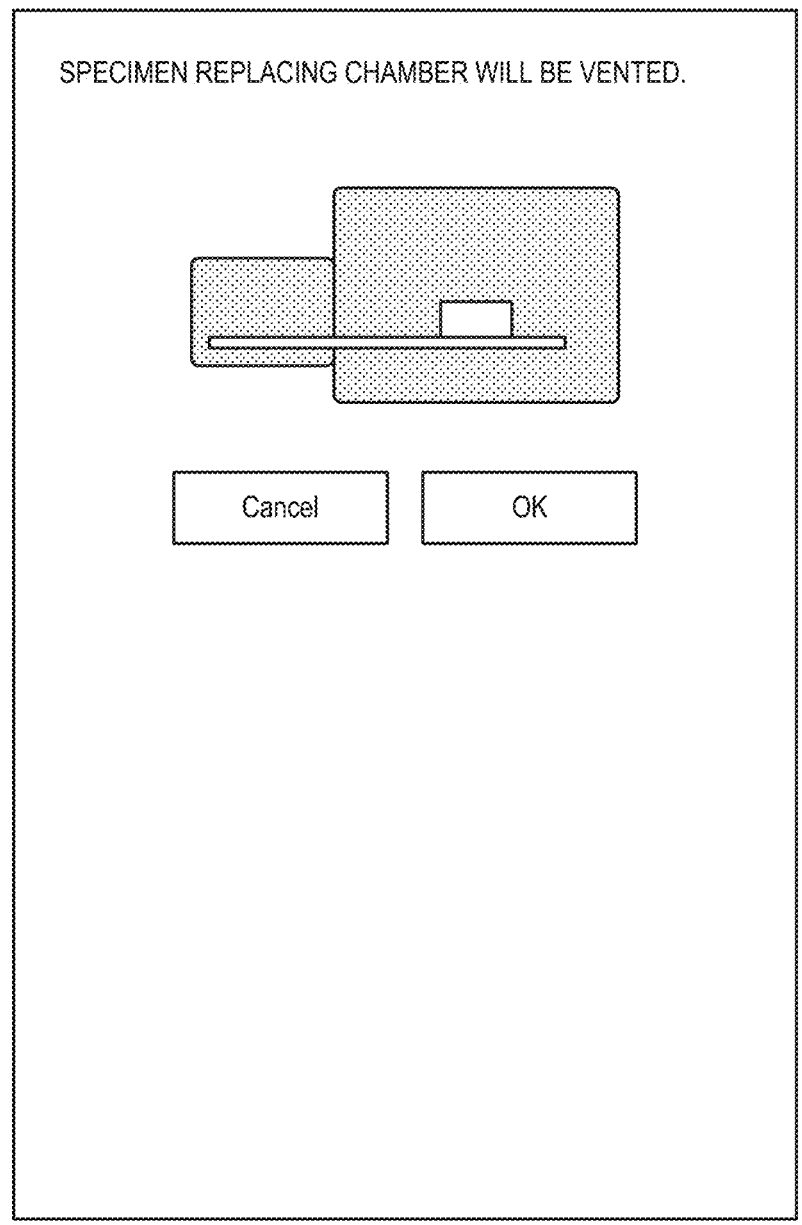
FIG. 3 is a diagram illustrating an example of a procedure of a recovery operation displayed in a wizard format.

FIG. 3 illustrates an initial screen of the recovery wizard. A screen 201 illustrated in FIG. 3 displays a diagram representing states of the specimen chamber 2, the specimen replacing chamber 3, and the specimen holder 7. The diagram illustrates that the specimen holder 7 is in the specimen chamber 2 and that the specimen chamber 2 and the specimen replacing chamber 3 are being exhausted. In addition, the screen 201 displays venting the specimen replacing chamber 3 as a first procedure of the recovery operation. Furthermore, the screen 201 displays an "OK" button (a control button), and when the user performs an operation to depress the "OK" button, the vacuum valve is driven after the isolation valve 5 is detected to be closed based on a signal from the sensor 16 and the specimen replacing chamber 3 is vented. It should be noted that when the user performs an operation to depress a "Cancel" button, the recovery wizard is ended.

Figure 4:
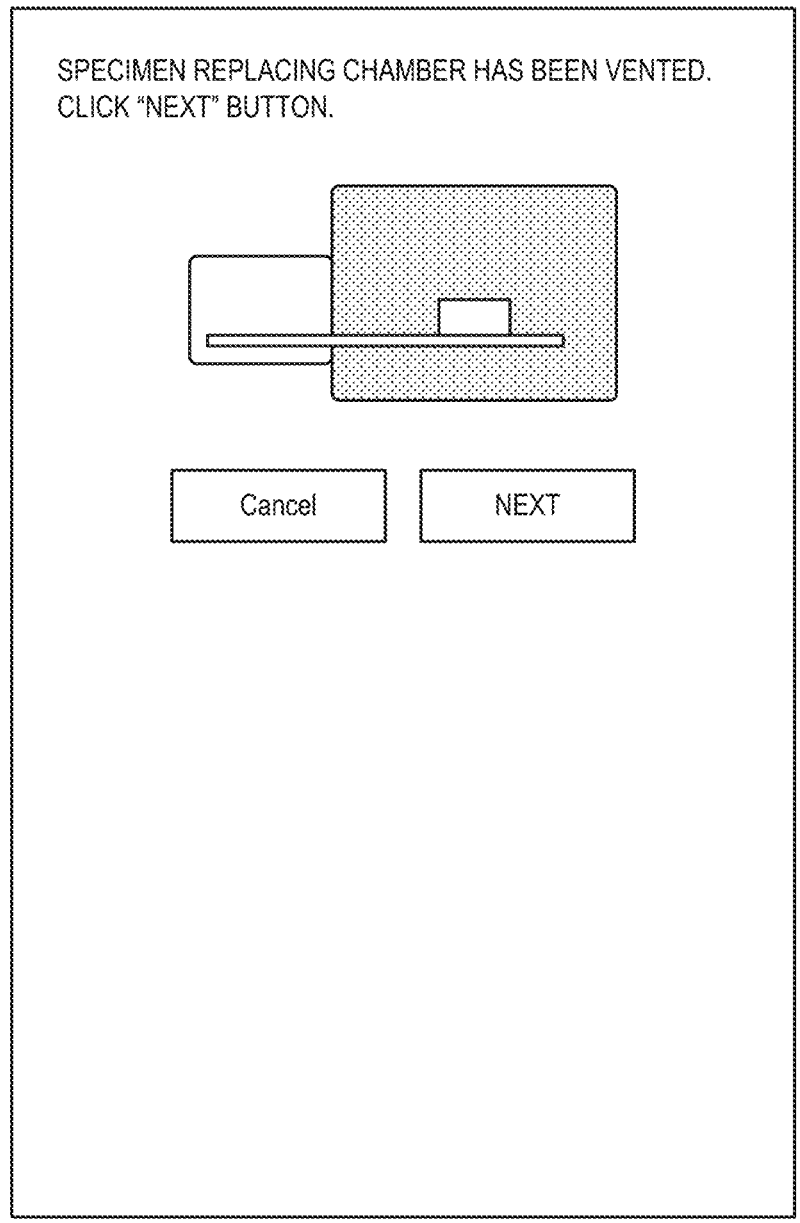
FIG. 4 is a diagram illustrating an example of a procedure of a recovery operation displayed in a wizard format.
Figure 5:
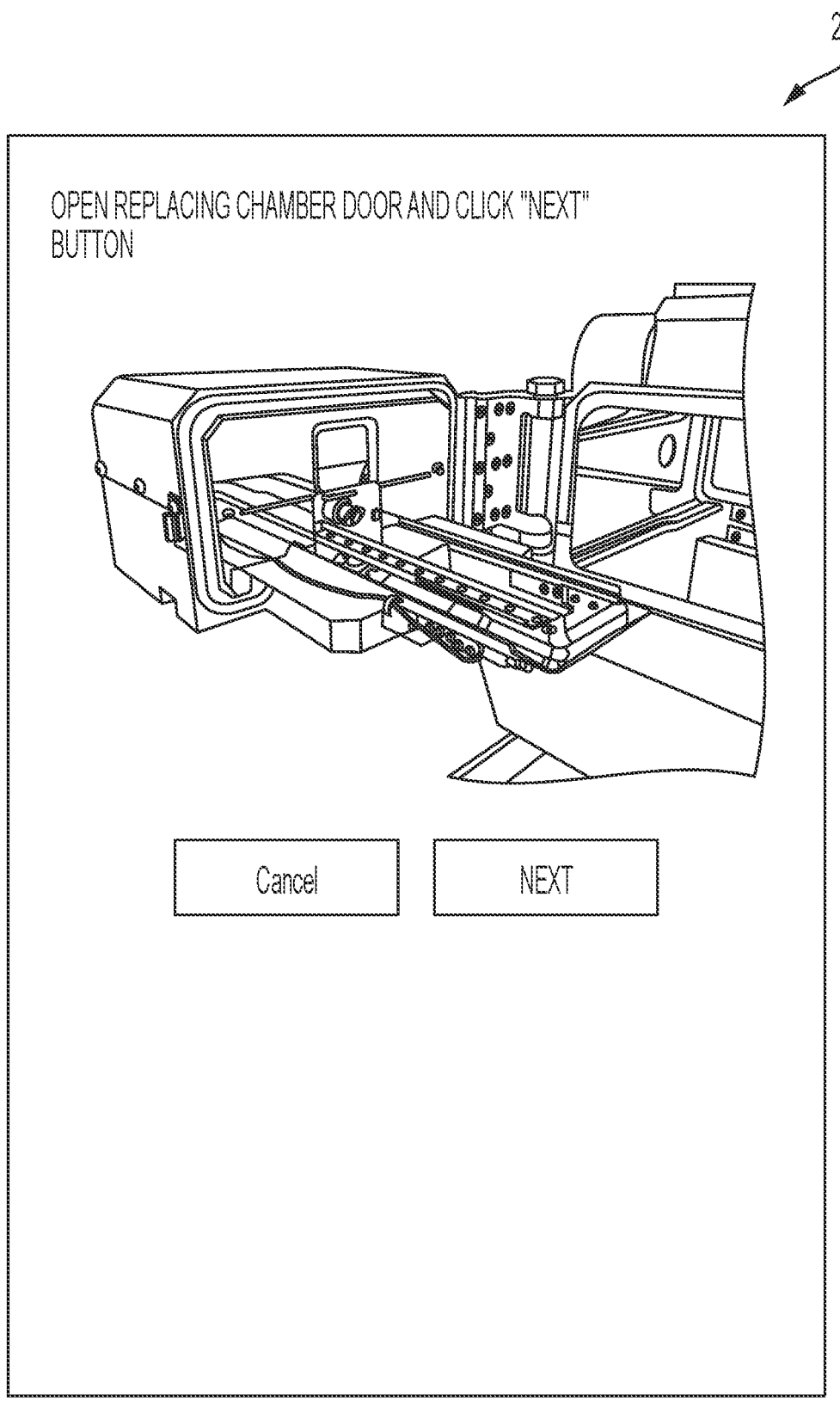
FIG. 5 is a diagram illustrating an example of a procedure of a recovery operation displayed in a wizard format.
Figure 6:
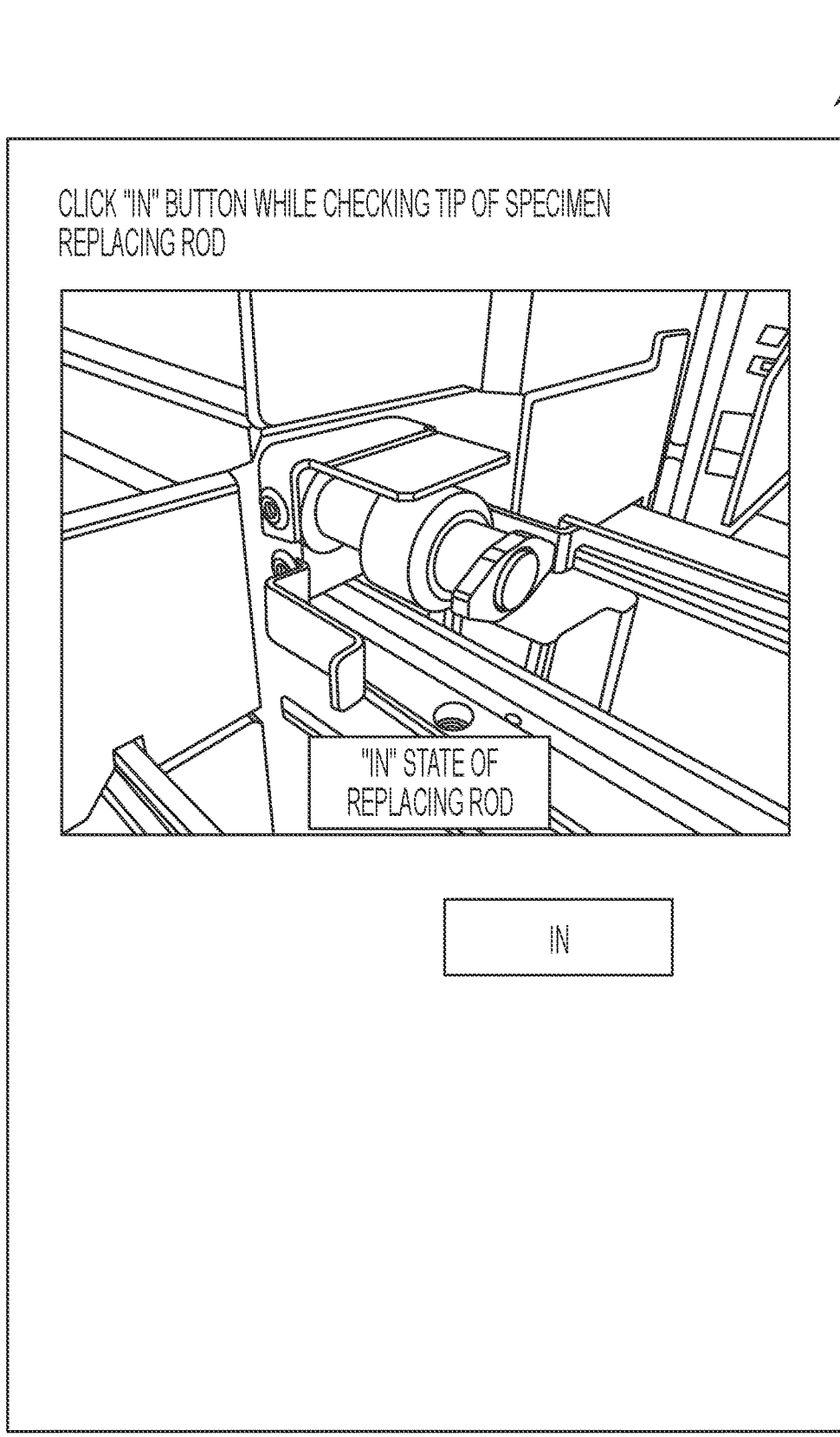
FIG. 6 is a diagram illustrating an example of a procedure of a recovery operation displayed in a wizard format.
Figure 7:
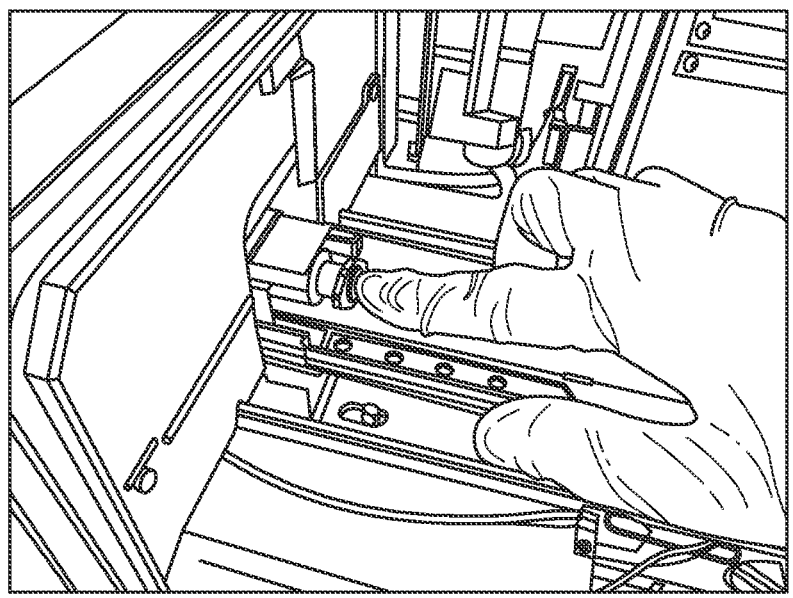
FIG. 7 is a diagram illustrating an example of a procedure of a recovery operation displayed in a wizard format.
Figure 7:
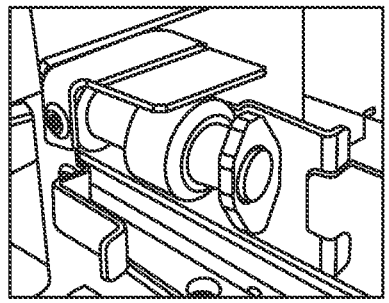
Figure 7:
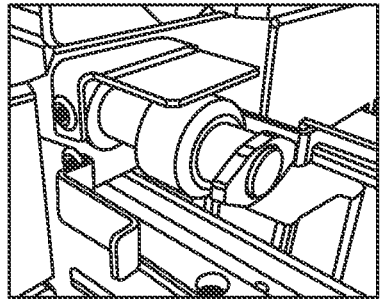
Figure 8:
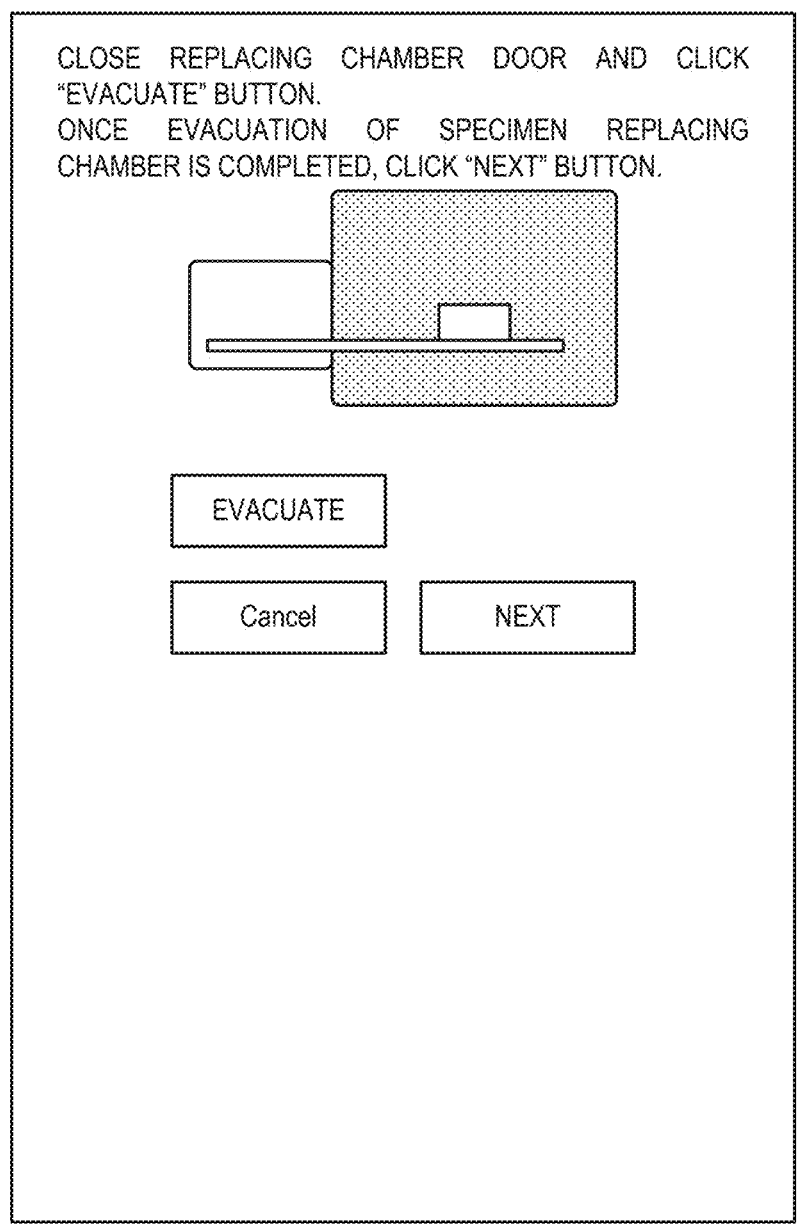
FIG. 8 is a diagram illustrating an example of a procedure of a recovery operation displayed in a wizard format.

When it is detected that the specimen replacing chamber 3 has been vented based on a signal from the sensor 11, a transition is made to a screen 202 illustrated in FIG. 4. The diagram displayed on the screen 202 indicates that the specimen replacing chamber 3 has been vented. When the user performs an operation to depress a "Next" button (a transition button) displayed on the screen 202, a transition is made to a screen 203 illustrated in FIG. 5.

The screen 203 displays opening the replacing chamber door 6 as a next procedure of the recovery operation and also displays a photograph of the replacing chamber door 6 in an open state. When the user opens the replacing chamber door 6 according to the displayed procedure and the replacing chamber door 6 is detected to be open based on a signal from the sensor 12, a "Next" button (a transition button) displayed on the screen 203 is enabled. When the user performs an operation to depress the enabled "Next" button, a transition is made to a screen 204 illustrated in FIG. 6.

The screen 204 displays moving the tip section of the specimen replacing rod 4 toward the side of the specimen chamber 2 from the left end position by a predetermined distance (several cm) (changing the tip section of the specimen replacing rod 4 to an IN state) as a next procedure of the recovery operation and also displays a photograph of the tip section in the IN state. In addition, the screen 204 displays an "IN" button (a control button) for changing the tip section of the specimen replacing rod 4 to the IN state. When the user performs an operation to depress the "IN" button, the replacing rod drive motor 10 is driven, the tip section of the specimen replacing rod 4 moves toward the side of the specimen chamber 2 from the left end position by the predetermined distance, and a transition is made to a screen 205 illustrated in FIG. 7.

The screen 205 displays manually depressing the tip section of the specimen replacing rod 4 to place the tip section of the specimen replacing rod 4 in the vertical state and subsequently moving the tip section of the specimen replacing rod 4 to the left end position (changing the tip section of the specimen replacing rod 4 to an OUT state) as a next procedure of the recovery operation, and also displays a photograph of a situation where the tip section of the specimen replacing rod 4 is manually depressed, a photograph of the tip section in the vertical state, and a photograph of the tip section in the horizontal state. In addition, the screen 205 displays an "OUT" button (a control button) for changing the tip section of the specimen replacing rod 4 to the OUT state. When the user manually depresses the tip section of the specimen replacing rod 4 to place the tip section in the vertical state and performs an operation to depress the "OUT" button according to the displayed procedure, the replacing rod drive motor 10 is driven and the tip section of the specimen replacing rod 4 is moved to the left end position, and when the tip section of the specimen replacing rod 4 is detected to be in the vertical state based on a signal from the sensor 13, a "Next" button (a transition button) displayed on the screen 205 is enabled. At a stage where the tip section of the specimen replacing rod 4 has been manually depressed and placed in the vertical state, since the tip section of the specimen replacing rod 4 is not at the left end position (not in the OUT state), whether or not the tip section has changed to the vertical state cannot be determined based on a signal from the sensor 13. In consideration thereof, in this procedure, an operation procedure and a control button for changing the tip section to the OUT state (a state where a determination that the tip section has changed to the vertical state can be made based on a signal from the sensor 13) are displayed, and once the tip section has been changed to the OUT state according to the procedure, a determination as to whether or not the tip section has changed to the vertical state is made based on a signal from the sensor 13. When the user performs an operation to depress the enabled "Next" button, a transition is made to a screen 206 illustrated in FIG. 8.

The screen 206 displays closing the replacing chamber door 6 and evacuating the specimen replacing chamber 3 as a next procedure of the recovery operation. When the user closes the replacing chamber door 6 according to the displayed procedure and the replacing chamber door 6 is detected to be closed based on a signal from the sensor 12, an "Evacuate" button (a control button) displayed on the screen 206 is enabled. When the user performs an operation to depress the enabled "Evacuate" button, the vacuum pump is driven and the specimen replacing chamber 3 is evacuated, and when the specimen replacing chamber 3 is detected to be evacuated based on a signal from the sensor 11, a "Next" button (a transition button) displayed on the screen 206 is enabled. When the user performs an operation to depress the enabled "Next" button, a transition is made to a screen 207 illustrated in FIG. 9.

The screen 207 displays a message to the effect that recovery has been completed and the specimen holder 7 can be removed by a normal specimen replacement operation (an operation for issuing an instruction to remove the specimen holder 7). When the user performs an operation to depress a "Complete" button displayed on the screen 207, the recovery wizard is ended.

According to the embodiment described above, when it is determined that a recoverable error has occurred based on a signal from a sensor, procedures of a recovery operation are displayed in a wizard format, a determination as to whether or not the recovery operation has been performed according to a displayed procedure is made based on a signal from a sensor, when it is determined that the recovery operation has been performed according to the procedure, a transition button for making a transition to a screen showing a next procedure is enabled, when an operation of the enabled transition button is performed, the screen showing the next procedure is displayed, but when a determination as to whether or not the recovery operation has been performed according to the procedure cannot be determined by the sensor, an operation is guided to a point where the determination can be made by the sensor, and a determination is made as to whether or not the recovery operation has been performed according to the procedure, thereby enabling a user to readily perform the recovery operation without making mistakes. In addition, according to the embodiment described above, when procedures of the recovery operation include a procedure for operating the apparatus, by displaying a control button for operating the apparatus, the user can perform the recovery operation without hesitation.

Alternatively, the transition button may not be displayed on the screen of the recovery wizard. In this case, when it is determined that the recovery operation has been performed according to a displayed procedure, a screen showing a next procedure may be displayed automatically (independent of an operation by the user).

3. Processes

Figure 10:
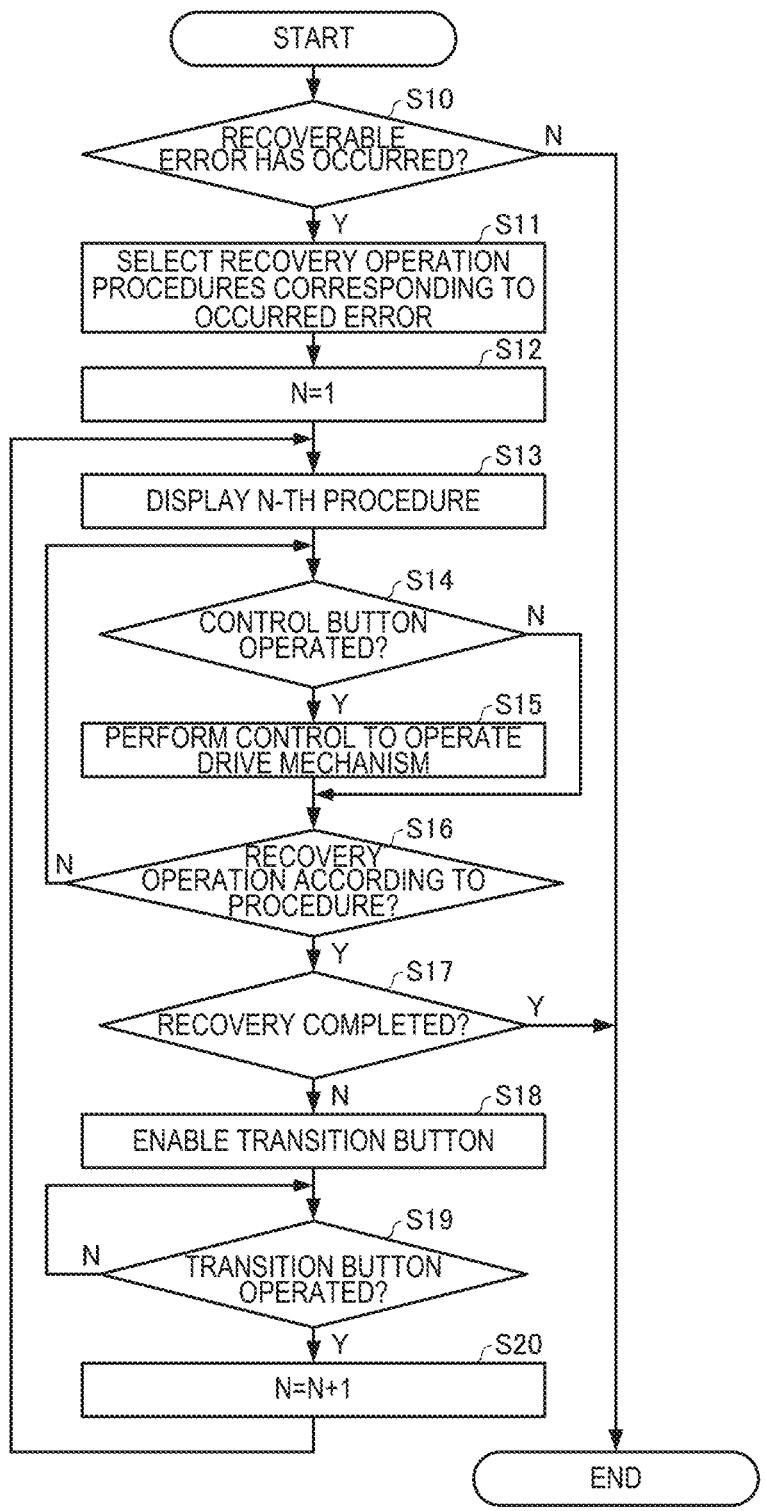
FIG. 10 is a flowchart illustrating a flow of processes of a vacuum apparatus according to an embodiment of the invention.

Next, an example of processes by the vacuum apparatus according to the embodiment described above will be described with reference to the flow chart illustrated in FIG. 10.

First, the determining unit 101 determines whether or not a recoverable error has occurred based on a signal from the detecting unit 120 (the sensors 11 to 21) (step S10). When a recoverable error has occurred (Y in step S10), the display control unit 102 selects procedures of a recovery operation corresponding to the occurred error from procedures of recovery operations respectively corresponding to a plurality of types of errors (step S11), and sets a variable N to 1 (step S12).

Next, the display control unit 102 causes the display unit 130 to display a screen showing an N-th procedure of the selected recovery operation (step S13). Next, the drive control unit 103 determines whether or not an operation with respect to a control button displayed on the screen has been performed (step S14), and when an operation with respect to the control button has been performed (Y in step S14), the drive control unit 103 performs control for operating the drive mechanism 140 in accordance with the operated control button (step S15). Next, the display control unit 102 determines whether or not the recovery operation has been performed according to the N-th procedure being displayed on the display unit 130 based on a signal from the detecting unit 120 (step S16). When the recovery operation has not been performed according to the N-th procedure (N in step S16), a transition is made to step S14. When the recovery operation has been performed according to the N-th procedure (Y in step S16), the display control unit 102 determines whether or not the recovery has been completed (whether or not all procedures of the recovery operation have been performed) (step S17), and when the recovery has been completed (Y in step S17), the display control unit 102 ends the process.

When the recovery has not been completed (N in step S17), the display control unit 102 enables a transition button on the screen (step S18). Next, the display control unit 102 determines whether or not an operation with respect to the enabled transition button has been performed (step S19), and when an operation with respect to the transition button has been performed (Y in step S19), the display control unit 102 adds 1 to the variable N (step S20) and makes a transition to step S13. Subsequently, the process of steps S13 to S20 is repeated until all of the procedures of the recovery operation are performed.

Note that this invention is not limited to the embodiments thereof described above and thus it can be implemented in many various ways. The invention includes configurations that are substantially the same (for example, in function, method, and results, or in objective and effects) as the configurations described in the embodiments. The invention also includes configurations in which non-essential elements described in the embodiments are replaced by other elements. The invention also includes configurations having the same effects as those of the configurations described in the embodiments, or configurations capable of achieving the same objectives as those of the configurations described in the embodiments. The invention further includes configurations obtained by adding known art to the configurations described in the embodiments.

Some embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

What is claimed is:

1. A vacuum apparatus equipped with an automatic transport mechanism for transporting a specimen and a sensor for detecting a state of the vacuum apparatus, the vacuum apparatus comprising:
   a determining unit which determines whether a recoverable error has occurred based on a signal from the sensor; and
   a display control unit which causes, when the recoverable error is determined to have occurred, a display unit to display a procedure of a recovery operation in a wizard format,
   wherein the display control unit determines whether the recovery operation has been performed according to the procedure displayed on the display unit based on the signal from the sensor, and causes the display unit to display a next procedure of the recovery operation when the recovery operation is determined to have been performed according to the procedure; and
   wherein, when the display control unit is unable to determine whether the recovery operation has been performed according to the procedure of the recovery operation based on the signal from the sensor, the display control unit causes the display unit to display an operation procedure for enabling the display control unit to determine whether the recovery operation has been performed.

2. The vacuum apparatus according to claim 1, wherein the display control unit causes the display unit to display a control button for operating the vacuum apparatus when the procedure of the recovery operation includes a procedure for operating the vacuum apparatus, and
   the vacuum apparatus further comprises a drive control unit which performs control to cause the vacuum apparatus to operate in response to an operation of the control button.

3. The vacuum apparatus according to claim 1, wherein when the display control unit determines that the recovery operation has been performed according to the procedure displayed on the display unit, the display control unit enables a transition button for making a transition to a screen showing the next procedure of the recovery operation, and when an operation of the transition button is performed, the display control unit causes the display unit to display the next procedure.

* * * * *